(12) United States Patent
Ishiguro

(10) Patent No.: US 7,982,389 B2
(45) Date of Patent: Jul. 19, 2011

(54) LIGHT-EMITTING DEVICE INCORPORATING AN INORGANIC INSULATING LAYER BETWEEN A REFLECTIVE LAYER AND CORRESPONDING PIXEL ELECTRODE

(75) Inventor: Hideto Ishiguro, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/379,034

(22) Filed: Feb. 11, 2009

(65) Prior Publication Data
US 2009/0159906 A1    Jun. 25, 2009

Related U.S. Application Data

(63) Continuation of application No. 11/565,319, filed on Nov. 30, 2006, now Pat. No. 7,508,004.

(30) Foreign Application Priority Data

Jan. 16, 2006    (JP) .................................. 2006-007153

(51) Int. Cl.
*H01L 51/50* (2006.01)
*H01L 51/52* (2006.01)

(52) U.S. Cl. .......................... 313/503; 313/506; 313/509
(58) Field of Classification Search ........... 313/500–512
See application file for complete search history.

(56) References Cited

U.S. PATENT DOCUMENTS

| 6,861,710 | B2 | 3/2005 | Murakami et al. | |
|---|---|---|---|---|
| 7,033,848 | B2 | 4/2006 | Murakami et al. | |
| 7,215,075 | B2 | 5/2007 | Kurata | |
| 7,492,012 | B2 | 2/2009 | Murakami et al. | |
| 2003/0156239 | A1* | 8/2003 | Inoue et al. | 349/113 |
| 2005/0206309 | A1 | 9/2005 | Shibasaki et al. | |
| 2005/0225232 | A1* | 10/2005 | Boroson et al. | 313/504 |
| 2007/0216289 | A1 | 9/2007 | Kuma et al. | |

FOREIGN PATENT DOCUMENTS

| JP | A 2003-114626 | 4/2003 |
|---|---|---|
| JP | 2003-197367 A | 7/2003 |
| JP | 2004-335207 A | 11/2004 |
| JP | 2005-266667 A | 9/2005 |
| WO | WO 2005-109964 A1 | 11/2005 |

* cited by examiner

*Primary Examiner* — Mariceli Santiago
(74) *Attorney, Agent, or Firm* — Oliff & Berridge PLC

(57) ABSTRACT

A light-emitting device includes an organic insulating layer lying above a face of a substrate, reflective layers arranged on a face of the organic insulating layer, an inorganic insulating layer extending over the reflective layers, pixel electrodes arranged on the inorganic insulating layer, and light-emitting sections arranged on the respective pixel electrodes. The inorganic insulating layer has openings and regions in which no pixel electrodes are arranged when viewed from above. The openings extend through the respective regions to the organic insulating layer. A method for manufacturing such a light-emitting device includes forming openings in regions of the inorganic insulating layer in advance of the formation of the light-emitting sections such that the openings extend through the regions to the organic insulating layer, the regions having no pixel electrodes thereon when viewed from above.

9 Claims, 9 Drawing Sheets

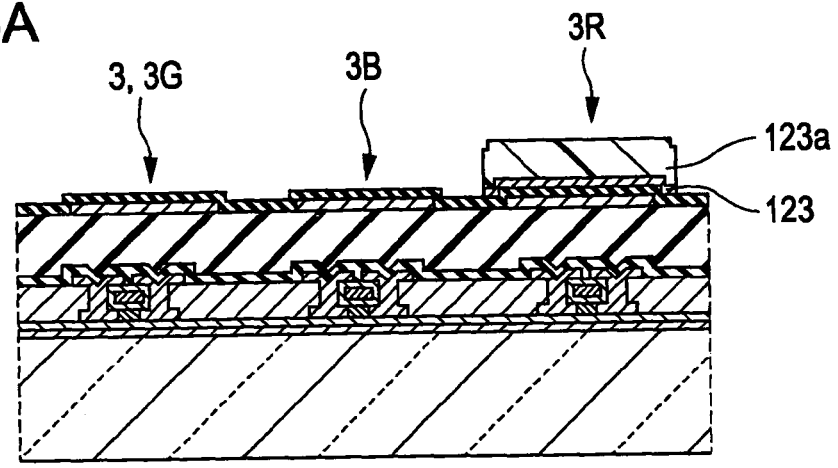
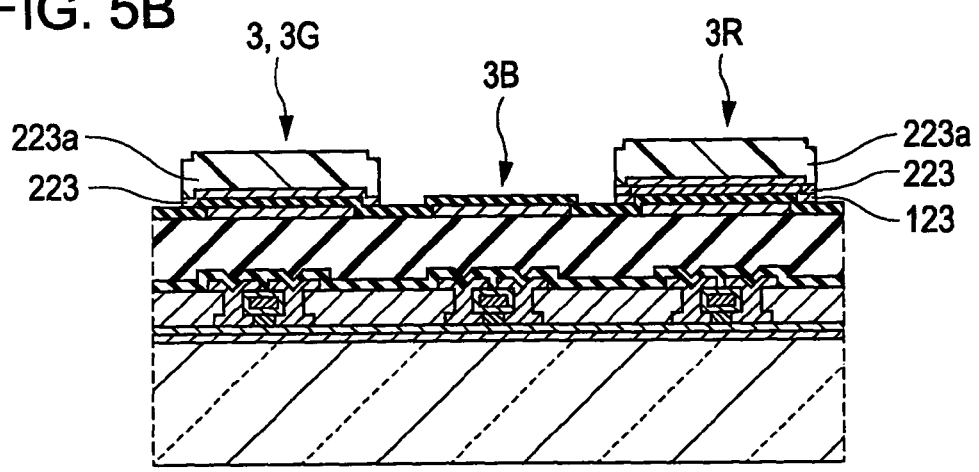
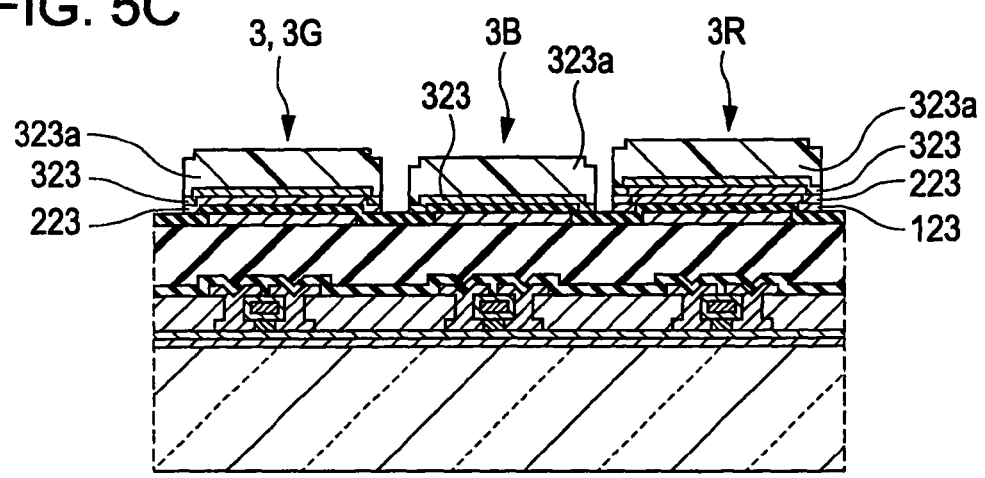

LIGHT-EMITTING DEVICE INCORPORATING AN INORGANIC INSULATING LAYER BETWEEN A REFLECTIVE LAYER AND CORRESPONDING PIXEL ELECTRODE

This is a Continuation of application Ser. No. 11/565,319 filed Nov. 30, 2006, now U.S. Pat. No. 7,508,004, issued Mar. 24, 2009. This application claims the benefit of Japanese Patent Application No. 2006-007153, filed Jan. 16, 2006. The entire disclosures of the prior applications is hereby incorporated by reference herein in their entirety.

BACKGROUND

1. Technical Field

The present invention relates to a light-emitting device, a method for manufacturing such a light-emitting device, and an electronic apparatus.

2. Related Art

In recent years, electroluminescent (EL) devices including EL elements which are self-luminous and which serve as pixels have been being developed. Japanese Unexamined Patent Application Publication No. 2003-114626 (hereinafter referred to as Patent Document 1) discloses a light-emitting element for light-emitting devices. The light-emitting element includes an insulating layer; thin-film transistors (TFTs) arranged on the insulating layer; an interlayer insulating layer which is made of an organic resin and which extends over the TFTs; and a light-emitting layer which is sandwiched between a pair of electrodes, which is disposed above the interlayer insulating layer, and which contains an organic compound.

According to Patent Document 1, the organic resin is moisture-permeable and absorbs water. The organic compound, which may have low or high molecular weight, is disadvantageous in being extremely susceptible to oxygen and moisture and therefore is readily deteriorated. An anode or cathode included in the light-emitting element contains an alkali metal or an alkaline-earth metal, which are readily oxidized by oxygen. That is, water or moisture degrades the light-emitting element to cause defects such as dark spots.

Patent Document 1 also discloses a light-emitting device including an inorganic insulating layer principally containing silicon and nitrogen or a carbon layer which has sp3 bonds and which contains hydrogen, the inorganic insulating or carbon layer being disposed between an insulating layer and a light-emitting element.

The light-emitting device disclosed in Patent Document 1 is a bottom emission type of organic EL device in which light emitted from a light-emitting layer is extracted through an element substrate. On the other hand, a top emission type of organic EL device in which light is extracted from the side opposite to an element substrate has been recently being developed.

FIG. 8A is a plan view of a conventional light-emitting device. FIG. 8B is a sectional view of the conventional light-emitting device taken along the line VIIIB-VIIIB of FIG. 8A. FIG. 9 is a sectional view of the conventional light-emitting device taken along the line IX-IX of FIG. 8A. The conventional light-emitting device is a top emission type of organic EL device. With reference to FIG. 8B, the conventional light-emitting device includes an element substrate 2 and reflective layers 27 arranged thereabove. An inorganic insulating layer 25 similar to that disclosed in Patent Document 1 lies between the reflective layers 27 and pixel electrodes 23.

In the conventional light-emitting device, as shown in FIG. 8A, a crack 90 is initiated at a corner of one of the reflective layers 27 to propagate along end portions of this reflective layer 27 in some cases. With reference to FIG. 9, the crack 90 propagates through the inorganic insulating layer 25 and one of the pixel electrodes 23. The crack 90 probably caused because the following stresses are concentrated on the end portions of this reflective layer 27: the residual stresses created during the formation of an organic insulating layer 284, the reflective layers 27, the inorganic insulating layer 25, and the pixel electrodes 23; the thermal stresses caused by differences in thermal expansion between these layers and electrodes; and other stresses. The presence of the crack 90 propagating through the inorganic insulating layer 25 and this pixel electrode 23 allows moisture contained in the organic insulating layer 284 to be diffused into an organic EL light-emitting element 3. This causes a problem that defects called dark spots arise.

SUMMARY

The present invention has been made to solve the above problem. An advantage of an aspect of the invention is that a light-emitting device in which dark spots can be prevented from arising is provided. An advantage of another aspect of the invention is that a method for manufacturing such a light-emitting device is provided. An advantage of another aspect of the invention is that an electronic apparatus having high reliability is provided.

A light-emitting device according to the present invention includes an organic insulating layer lying above a face of a substrate, reflective layers arranged on a face of the organic insulating layer, an inorganic insulating layer extending over the reflective layers, pixel electrodes arranged on the inorganic insulating layer, and light-emitting sections arranged on the respective pixel electrodes. The inorganic insulating layer has openings and regions in which no pixel electrodes are arranged when viewed from above. The openings extend through the respective regions to the organic insulating layer.

Since the openings are arranged in the inorganic insulating layer, the release of moisture contained in the organic insulating layer is not prevented by the inorganic insulating layer and therefore the moisture therein can be removed through the openings. This prevents dark spots from being caused by the diffusion of the moisture into the light-emitting sections from the organic insulating layer.

In the light-emitting device, the openings preferably occupy most of the regions having no pixel electrodes. This allows the openings to have a maximum area; hence, the moisture can be readily removed from the organic insulating layer. This prevents the dark spots from being caused.

The present invention provides a method for manufacturing a light-emitting device including an organic insulating layer lying above a face of a substrate, reflective layers arranged on a face of the organic insulating layer, an inorganic insulating layer extending over the reflective layers, pixel electrodes arranged on the inorganic insulating layer, and light-emitting sections arranged on the respective pixel electrodes. The method includes forming openings in regions of the inorganic insulating layer in advance of the formation of the light-emitting sections such that the openings extend through the regions to the organic insulating layer, the regions having no pixel electrodes thereon when viewed from above.

Since the openings are formed in the inorganic insulating layer in advance of the formation of the light-emitting sections, the release of moisture contained in the organic insulating layer is not prevented by the inorganic insulating layer and therefore the moisture therein can be removed through the openings. This prevents dark spots from being caused by the diffusion of the moisture into the light-emitting sections from the organic insulating layer.

The method preferably further includes removing moisture contained in the organic insulating layer through the openings by heating the organic insulating layer in advance of the formation of the light-emitting sections. This allows the moisture therein to be readily removed from the organic insulating layer, thereby preventing the dark spots from being caused.

The method preferably further includes forming partitions made of an organic material on regions having no light-emitting sections and removing moisture contained in the organic insulating layer through the openings by heating the organic insulating layer in advance of the formation of the light-emitting sections. This allows the moisture therein to be readily removed from the organic insulating layer and also allows moisture to be readily removed from the partitions.

The method preferably further includes forming through holes in the inorganic insulating layer such that the through holes connect the pixel electrodes to switching elements, arranged below the organic insulating layer, for controlling the application of currents to the pixel electrodes, wherein the openings are formed simultaneously with the formation of the through holes. Since the openings are formed simultaneously with the formation of the through holes, the openings can be efficiently formed without increasing the number of manufacturing steps.

In the method, the openings are formed subsequently to the formation of the pixel electrodes. According to this procedure, the inorganic insulating layer is formed over the organic insulating layer in advance of the formation of the pixel electrodes; hence, the organic insulating layer can be protected from an etching solution for forming the pixel electrodes. This prevents the organic insulating layer from swelling due to the etching solution, thereby preventing the organic insulating layer from being cracked or peeled off.

In the method, the openings are preferably formed subsequently to the formation of the pixel electrodes using a mask for forming the pixel electrodes or using the pixel electrodes as masks. According to this procedure, a mask for forming the openings need not be used. This is effective in preventing an increase in manufacturing cost. Furthermore, since the openings occupy most of the regions having no pixel electrodes and therefore have a maximum area, the moisture can be readily removed from the organic insulating layer, thereby preventing the dark spots from being caused.

In the method, the openings are preferably formed subsequently to the formation of the pixel electrodes having different thicknesses. This prevents the organic insulating layer from swelling due to the etching solution, thereby preventing the organic insulating layer from being cracked or peeled off. Furthermore, the openings can be formed using the mask for forming the pixel electrodes or using the pixel electrodes as masks. This is effective in preventing an increase in manufacturing cost.

An electronic apparatus according to the present invention includes the light-emitting device described above. Since the light-emitting device is free from the dark spots, the electronic apparatus has high reliability.

BRIEF DESCRIPTION OF THE DRAWINGS

The present invention will be described with reference to the accompanying drawings, wherein like numbers reference like elements.

FIG. 5A is a sectional view showing a step of forming pixel electrodes.

FIG. 5B is a sectional view showing a step of forming the pixel electrodes.

FIG. 5C is a sectional view showing a step of forming the pixel electrodes.

DESCRIPTION OF EXEMPLARY EMBODIMENTS

Embodiments of the present invention will now be described with reference to the accompanying drawings. In order to provide a clear understanding of the drawings, the size of components varies for each drawing.

First Embodiment

Figure 1A:
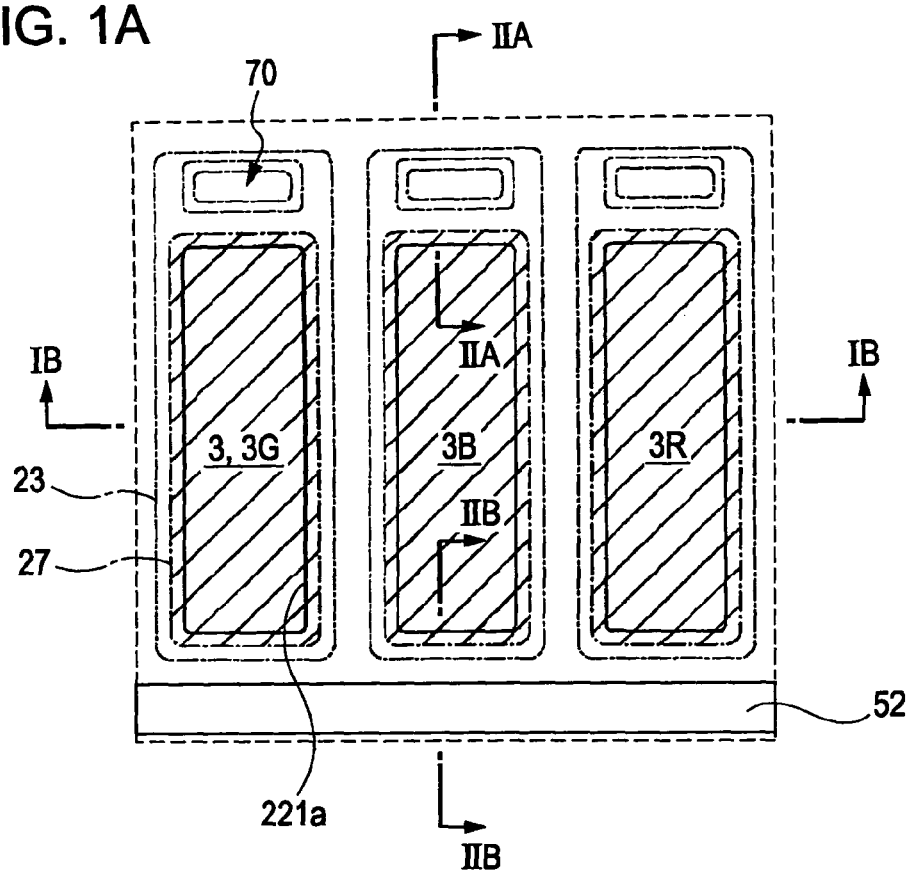
FIG. 1A is a plan view of a light-emitting device according to a first embodiment of the present invention.

FIG. 1A is a plan view of a light-emitting device according to a first embodiment of the present invention.

Figure 1B:
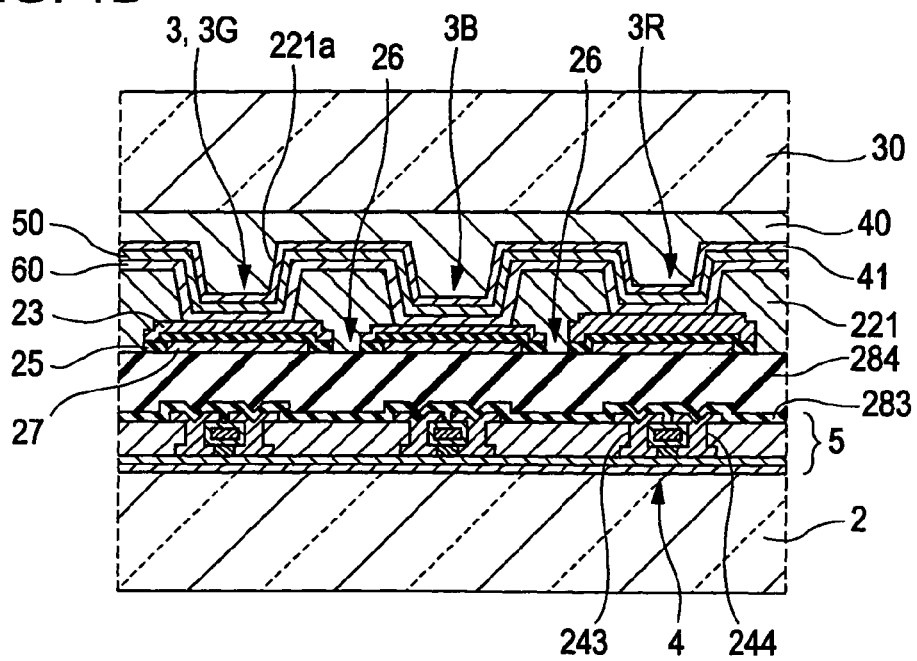
FIG. 1B is a sectional view of the light-emitting device taken along the line IB-IB of FIG. 1A.
Figure 2A:
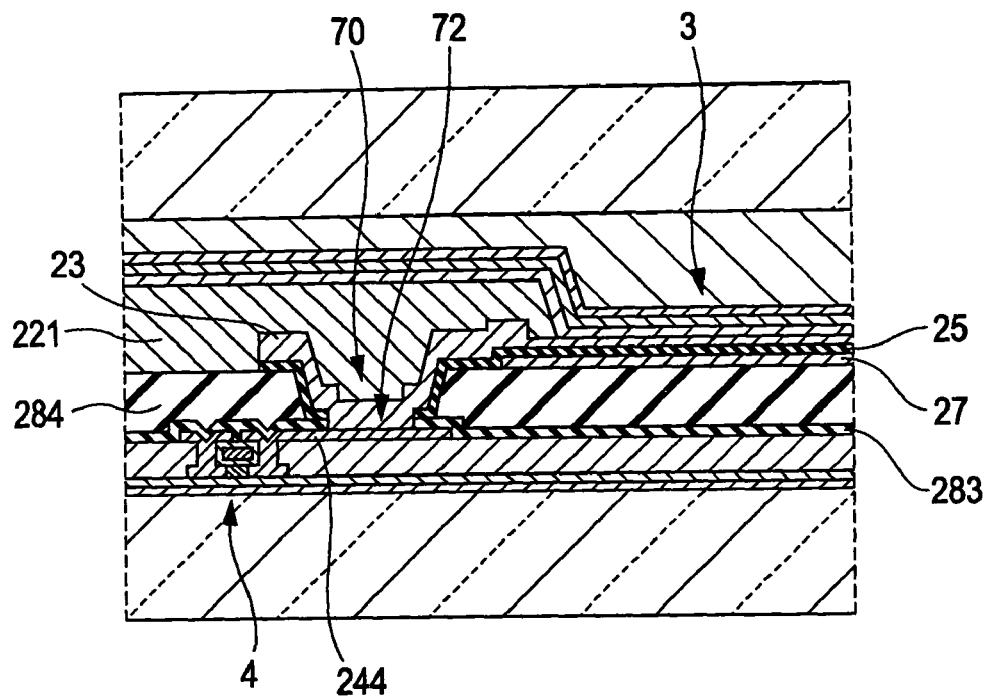
FIG. 2A is a sectional view of the light-emitting device taken along the line IIA-IIA of FIG. 1A.
Figure 2B:
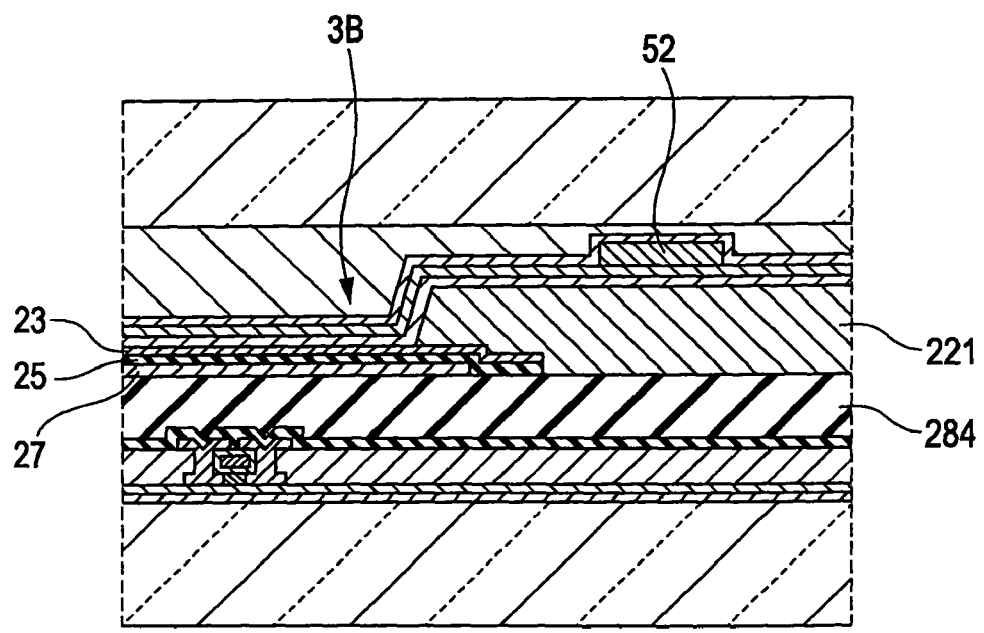
FIG. 2B is a sectional view of the light-emitting device taken along the line IIB-IIB of FIG. 1A.

FIG. 1B is a sectional view of the light-emitting device taken along the line IB-IB of FIG. 1A. FIG. 2A is a sectional view of the light-emitting device taken along the line IIA-IIA of FIG. 1A. FIG. 2B is a sectional view of the light-emitting device taken along the line IIB-IIB of FIG. 1A. As shown in FIG. 1B, the light-emitting device is a top emission type of organic EL device having optical resonant structures. The light-emitting device includes an organic insulating layer 284, reflective layers 27, an inorganic insulating layer 25, pixel electrodes 23, and light-emitting sections. The inorganic insulating layer 25 has openings 26 and regions in which no pixel electrodes 23 are arranged when viewed from above. The openings 26 extend through the respective regions having no pixel electrodes 23 to the organic insulating layer 284.

In the light-emitting device, light emitted from a light-emitting layer 60 is extracted through a sealing substrate 30 as shown in FIG. 1B; therefore, an element substrate 2 may be made of a transparent or opaque material. Examples of the transparent material include glass, quartz, and resin. In particular, glass is preferably used.

A driving circuit section 5 including driving TFTs 4, which may be referred to as switching elements, for driving light-emitting elements 3 is disposed above the element substrate 2. Alternatively, the light-emitting device may include a semiconductor element or an IC chip, mounted on the element substrate 2, including a driving circuit instead of the driving circuit section 5.

A first interlayer insulating layer 283 principally made of silicon dioxide ($SiO_2$) overlies the driving circuit section 5. The organic insulating layer 284, which may be referred to as a planarization layer, overlies the first interlayer insulating layer 283 and is principally made of a photosensitive insulating resin, such as an acrylic resin or a polyimide resin, having heat resistance. The organic insulating layer 284 is necessary to conceal irregularities due to the driving TFTs 4, source electrodes 243, drain electrodes 244, and the like.

The reflective layers 27 are arranged on the organic insulating layer 284. The reflective layers 27 are preferably made of a metal material, such as silver (Ag) or aluminum (Al), having high reflectance. As shown in FIG. 1A, the reflective layers 27 have an area greater than that of the light-emitting elements 3 when viewed from above, that is, when viewed in the direction of the normal to the element substrate 2. This allows the light-emitting device to have high aperture ratio.

As shown in FIG. 1B, the inorganic insulating layer 25, which may be referred to as a passivation layer or an etching protection layer, overlies the reflective layers 27 and is made of $SiO_2$ or silicon nitride (SiN). The inorganic insulating layer 25 has a function of electrically isolating the reflective layers 27 from the pixel electrodes 23, that is, a function of preventing the electrical conduction between the reflective layers 27 and the pixel electrodes 23. The inorganic insulating layer 25 also has a function of protecting the reflective layers 27 and the organic insulating layer 284 from an etching solution for forming the pixel electrodes 23 by patterning.

The pixel electrodes 23 are arranged on the inorganic insulating layer 25. As shown in FIG. 1A, the pixel electrodes 23 have an area greater than that of regions for forming the light-emitting elements 3. This allows the light-emitting device to have high aperture ratio. The pixel electrodes 23 are arranged in a matrix pattern. Contact holes 70 are located close to the light-emitting elements 3 and extend through the organic insulating layer 284. As shown in FIG. 2A, the inorganic insulating layer 25 extends over the walls and bottoms of the contact holes 70 and through holes 72 extend from the bottoms of the contact holes 70 through the inorganic insulating layer 25 and the first interlayer insulating layer 283. The pixel electrodes 23 are electrically connected to the drain electrodes 244 of the driving TFTs 4 with the contact holes 70 and the through holes 72.

With reference back to FIG. 1B, the openings 26 extend through the regions having no pixel electrodes 23. In this embodiment, the pixel electrodes 23 are arranged on the inorganic insulating layer 25 and the openings 26 occupy most of the regions having no pixel electrodes 23.

Alternatively, the openings 26 may occupy small parts of the regions having no pixel electrodes 23.

The pixel electrodes 23 are surrounded by organic partitions 221 made of an organic insulating material such as polyimide. Portions of the organic partitions 221 are disposed on end portions of the pixel electrodes 23. The organic partitions 221 have open zones 221a. The pixel electrodes 23 are exposed at the bottoms of the open zones 221a. A plurality of functional layers extend over the pixel electrodes 23 exposed at the bottoms of the open zones 221a, thereby forming the light-emitting elements 3. That is, the open zones 221a define regions for forming the light-emitting elements 3.

The light-emitting elements 3 include the pixel electrodes 23 serving as anodes, portions of the light-emitting layer 60 containing an organic EL substance, and portions of a common electrode 50 serving as a cathode, the pixel electrodes 23, the light-emitting layer 60, and the common electrode 50 being arranged in that order. The light-emitting elements 3 serve as sub-pixels corresponding to image display units and are classified into three types of elements emitting different color lights: green light-emitting elements 3G, blue light-emitting elements 3B, and red light-emitting elements 3R. One pixel consists of each green light-emitting element 3G, blue light-emitting element 3B, and red light-emitting element 3R.

The pixel electrodes 23 are made of a transparent conductive material such as indium tin oxide (ITO). The pixel electrodes 23 may be reflective. In this case, the pixel electrodes 23 are preferably made of a conductive material, such as Ag or Al, having high reflectance.

A hole injection layer for injecting and transporting holes, supplied from the pixel electrodes 23, into the light-emitting layer 60 may be placed between the pixel electrodes 23 and the light-emitting layer 60. A material for forming the hole injection layer is preferably a 3,4-polyethylenedioxythiophene/polystyrene sulfonic acid (PEDOT/PSS) dispersion. The dispersion is prepared by dispersing 3,4-polyethylenedioxythiophene in polystyrene sulfonic acid serving as a dispersion medium. Water is preferably added to the dispersion.

The material for forming hole injection layer is not limited to the above dispersion and may be a dispersion prepared by dispersing the following polymer in an appropriate dispersion medium such as polystyrene sulfonic acid described above: polystyrene, polypyrrole, polyaniline, polyacetylene, or its derivative. Alternatively, the hole injection layer can be formed by, for example, a vacuum vapor deposition process using a low-molecular-weight material. Examples of the low-molecular-weight material include aromatic amines such as 4,4'-bis(N-(naphthyl)-N-phenyl-amino)biphenil (α-NPD) and 4,4',4''-tris(N-3-methylphenyl-N-phenyl-amino)triphenylamine (MTDATA), phthalocyanines such as copper phthalocyanine (CuPc), and derivatives of these compounds.

A known luminescent material emitting phosphorescent or fluorescent light can be used to form the light-emitting layer 60. Preferable examples of the luminescent material include polyfluorenes (PFs), polyparaphenylene vinylenes (PPVs), polyphenylenes (PPs), polyparaphenylenes (PPPs), polyvinylcarbazoles (PVKs), polythiophenes, and polysilanes such as polymethylphenylsilane (PMPS). These polymers may be doped with a high-molecular-weight dye such as a perylene dye, a coumarin dye, or a rhodamine dye or a low-molecular-weight dye such as rubrene, perylene, 9,10-diphenylanthracene, tetraphenylbutadiene, Nile red, coumarin-6, or quinacridone. Alternatively, the light-emitting layer 60 can be formed from a low-molecular-weight material, such as carbazole (CBP), doped with the low-molecular-weight dye. The light-emitting layer 60 may include an electron transport sublayer containing tris(8-quinolinolato) aluminum (Alq3).

The common electrode 50 covers substantially the whole of the element substrate 2. The common electrode 50 is made of a material containing a component, such as magnesium (Mg), lithium (Li), or calcium (Ca), having low work function. The common-electrode 50 preferably includes a light-transmissive conductive thin-film made of Mg—Ag in which the ratio of Mg to Ag is 10:1. Alternatively, the common electrode 50 may include a Mg—Ag—Al thin-film, a Li—Al thin-film, or a Li—F—Al thin-film. The common electrode 50 may include one of these alloy thin-films and a transparent conductive thin-film made of ITO or the like in combination.

Since the light-emitting device is a top emission type as described above, the common electrode 50 has a thin-film shape such that high light extraction efficiency can be achieved; hence, the common electrode 50 is low in conductivity. As shown in FIG. 1A, an auxiliary electrode 52 that is line-shaped is disposed on the common electrode 50. The auxiliary electrode 52 supplements the conductivity of the common electrode 50 and is made of a metal material, such as Al, Au, or Ag, having high conductivity. In order to prevent a reduction in aperture, the auxiliary electrode 52 is disposed around the sub-pixels. The auxiliary electrode 52 may have a light-shielding function. The auxiliary electrode 52 extends transversely over the element substrate 2. Alternatively, a plurality of auxiliary electrodes extending in one or two directions may be arranged on the common electrode 50 in a striped pattern or a lattice pattern, respectively.

With reference back to FIG. 1B, an inorganic sealing layer 41 made of $SiO_2$ or the like lies on the common electrode 50. A sealing substrate 30 made of a transparent material such as glass is joined to the inorganic sealing layer 41 with an adhesive layer 40 disposed therebetween. The inorganic sealing layer 41 prevents moisture, oxygen, and the like passing through the sealing substrate 30 from permeating the light-emitting elements 3. Moisture, oxygen, and the like may be captured in such a manner that a sealing cap entirely covering the common electrode 50 is provided above the element substrate 2, end portions of the sealing cap are fixed to those of the element substrate 2, and a getter absorbing moisture, oxygen, and the like is placed inside the sealing cap.

In the light-emitting device, image signals supplied from outside are applied to the pixel electrodes 23 with the driving TFTs 4 at predetermined timing. Holes injected from the pixel electrodes 23 and electrons injected from the common electrode 50 are recombined with each other in the light-emitting layer 60, whereby light with a specific wavelength is emitted. Since the holes are injected through junctions between the light-emitting layer 60 and the pixel electrodes 23, the junctions therebetween function as light-emitting sections. Lights emitted from the light-emitting sections toward the common electrode 50 are extracted through the sealing substrate 30. Lights emitted therefrom toward the pixel electrodes 23 are reflected by the reflective layers 27 and then extracted through the sealing substrate 30. This allows an image to be displayed through the sealing substrate 30.

The common electrode 50 shown in FIG. 1B functions as a transflective layer that allows a portion of light emitted from the light-emitting layer 60 to pass therethrough and reflects the rest of the light toward the reflective layers 27. In usual, a light-transmissive conductive layer such as a metal thin-film has a reflectance of 10% to 50% when this layer is in contact with the light-emitting layer 60. Therefore, the common electrode 50 functions as such a transflective layer when the common electrode 50 includes the light-transmissive conductive layer. Since the light-emitting layer 60 is sandwiched between the common electrode 50 having such a transflective function and the reflective layers 27, light emitted from the light-emitting layer 60 is resonated between the common electrode 50 and the reflective layers 27, that is, the light-emitting elements 3 have respective optical resonant structures. In the light-emitting device, light emitted from the light-emitting layer 60 travels between the reflective layers 27 and the common electrode 50; hence, only components of the light that have resonant wavelengths corresponding to the travel distances thereof are extracted from the light-emitting device in an amplified manner. This allows light having high brightness and sharp spectrum to be extracted.

Lights emitted from the green, blue, and red light-emitting elements 3G, 3B, and 3R have wavelengths equal to the resonant wavelengths of the optical resonant structures of the green, blue, and red light-emitting elements 3G, 3B, and 3R, that is, wavelengths corresponding to the optical distances between the reflective layers 27 and the common electrode 50. The optical distances therebetween are equal to the sums of the optical distances of the components disposed between the reflective layers 27 and the common electrode 50. The optical distance of each component disposed therebetween depends on the product of the thickness and refractive index of this component. The lights emitted from the green, blue, and red light-emitting elements 3G, 3B, and 3R have different colors and therefore the optical resonant structures of the green, blue, and red light-emitting elements 3G, 3B, and 3R have different resonant wavelengths. In this embodiment, these resonant wavelengths depend on the thicknesses of the pixel electrodes 23 located close to the element substrate 2. The pixel electrodes 23 placed in the red light-emitting elements 3R emitting light with the longest wavelength have the greatest thickness. The pixel electrodes 23 placed in the green light-emitting elements 3G have a thickness less than that of the pixel electrodes 23 placed in the red light-emitting elements 3R. The pixel electrodes 23 placed in the blue light-emitting elements 3B have a thickness less than that of the electrodes 23 placed in the green light-emitting elements 3G.

Since the colors of the lights emitted from the green, blue, and red light-emitting elements 3G, 3B, and 3R depend on the thicknesses of the pixel electrodes 23, the light-emitting layer 60 need not contain compounds that are different from each other depending on the green, blue, and red light-emitting elements 3G, 3B, and 3R. Therefore, the light-emitting layer 60 may contain a single luminescent compound emitting white light, that is, the green, blue, and red light-emitting elements 3G, 3B, and 3R may commonly contain such a luminescent compound. In this case, the green, blue, and red light-emitting elements 3G, 3B, and 3R have the same life; hence, the color texture of a displayed image does not vary even if the light-emitting device is used for a long period. Since lights other than those having specific wavelengths are not used to display an image, luminescent compounds each suitable for the corresponding sub-pixels are preferably used to achieve high light utilization efficiency. That is, if a green, a blue, and a red luminescent compound are contained in the green, blue, and red light-emitting elements 3G, 3B, and 3R, respectively, and the optical distances of the optical resonant structures are adjusted to the peak wavelengths of these luminescent compounds, high light utilization efficiency can be achieved and a bright image can be displayed.

Second Embodiment

A second embodiment of the present invention provides a method for manufacturing the light-emitting device shown in FIG. 1A. FIGS. 3A to 3C and 4A to 4C are sectional views, taken along the line IIB-IIB of FIG. 1A, showing steps included in the method of this embodiment.

Figure 3A:
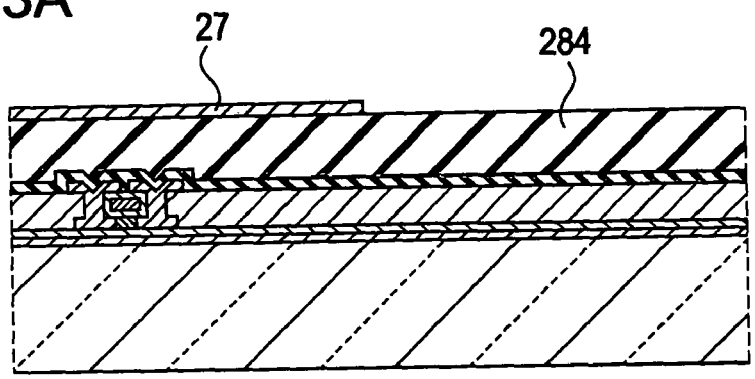
FIG. 3A is a sectional view showing a step included in a method for manufacturing the light-emitting device according to a second embodiment.
Figure 3B:
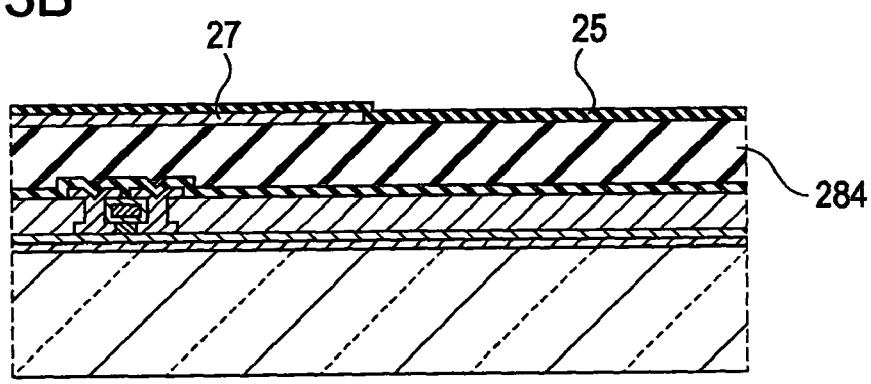
FIG. 3B is a sectional view showing a step included in the method of the second embodiment.

As shown in FIG. 3A, the reflective layers 27 are formed on the organic insulating layer 284. In particular, a layer of a material, such as Al or Ag, having high reflectance is formed over the organic insulating layer 284 by a sputtering process or a vapor deposition process. This layer is patterned into portions having a predetermined shape by a photolithographic process, whereby the reflective layers 27 are formed. As shown in FIG. 3B, the inorganic insulating layer 25 is formed over the reflective layers 27 and the organic insulating layer 284. The inorganic insulating layer 25 can be formed by a chemical vapor deposition (CVD) process, a physical vapor deposition (PVD) process, or a coating process such as a sol-gel process.

Figure 3C:
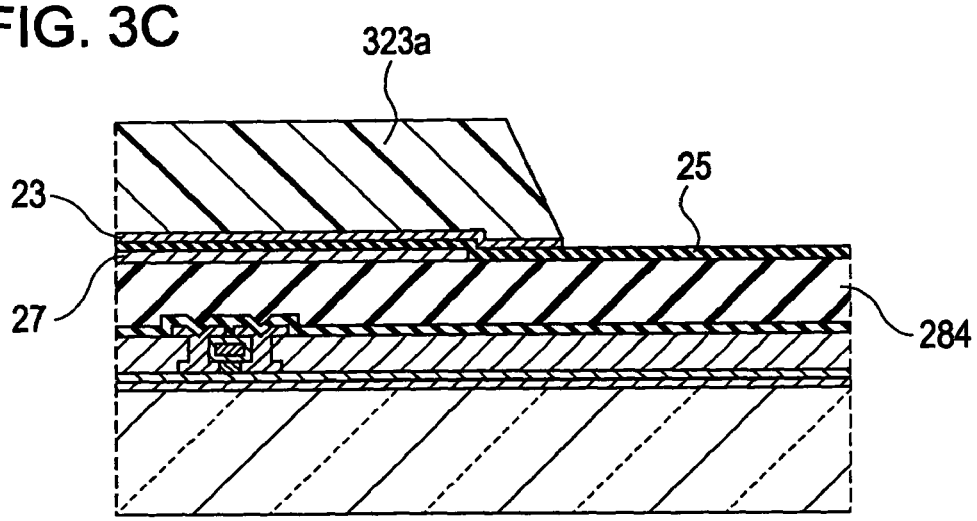
FIG. 3C is a sectional view showing a step included in the method of the second embodiment.

As shown in FIG. 3C, the pixel electrodes 23 are formed on the respective inorganic insulating layer 25. In particular, a layer of a transparent conductive material such as ITO is formed over the inorganic insulating layer 25 by a sputtering process, a vapor deposition process, or another process. This layer is patterned into portions having a predetermined shape by a photolithographic process, whereby the pixel electrodes 23 are formed. In particular, a resist is applied over this layer by a coating process and subjected to exposure and then development, whereby a mask 323a having a predetermined pattern is formed. This layer is etched through the mask 323a, whereby the pixel electrodes 23 are formed. This layer can be wet-etched using an etching solution containing ferric chloride or hydrogen chloride.

A procedure for forming the pixel electrodes 23 for forming the optical resonant structures will now be described in detail. FIGS. 5A to 5C are sectional views, taken along the line IB-IB of FIG. 1A, showing steps of forming the pixel electrodes 23. As shown in FIG. 5A, first pixel sub-electrodes 123 are formed in regions for forming the red light-emitting elements 3R using a first mask 123a made of a resist. As shown in FIG. 5B, second pixel sub-electrodes 223 are formed in the regions for forming the red light-emitting elements 3R and regions for forming the green light-emitting elements 3G using a second mask 223a. As shown in FIG. 5C, third pixel sub-electrodes 323 are formed in the regions for forming the red light-emitting elements 3R, the regions for forming green light-emitting elements 3G, and regions for forming blue light-emitting elements 3B using a third mask 323a. A detailed technique for forming the first, second, or third sub-electrodes 123, 223, or 323 is the same as that described above.

The third pixel sub-electrodes 323 has a thickness equal to that of the pixel electrodes 23 to be formed in regions for forming the blue light-emitting elements 3B. The second pixel sub-electrodes 223 have a thickness equal to the difference between the thickness of the pixel electrodes 23 to be formed in regions for forming the green light-emitting elements 3G and the thickness of the third pixel sub-electrodes 323. The first pixel sub-electrodes 123 have a thickness equal to the difference between the thickness of the pixel electrodes 23 to be formed in regions for forming the red light-emitting elements 3R and the sum of the thicknesses of the second and third pixel sub-electrodes 223 and 323. These allow the pixel electrodes 23, formed in the regions for forming the green, blue, and red light-emitting elements 3G, 3B, and 3R, to have different thicknesses meeting optical resonant conditions.

With reference to FIG. 5C, the third pixel sub-electrodes 323 are disposed in the regions for forming the green, blue, and red light-emitting elements 3G, 3B, and 3R and the third mask 323a lies over the third pixel sub-electrodes 323.

With reference back to FIG. 4A, the inorganic insulating layer 25 is etched through the third mask 323a, whereby the inorganic insulating layer 25 is etched into portions having a predetermined shape. The inorganic insulating layer 25 can be dry-etched with an etchant such as gaseous carbon tetrafluoride ($CF_4$). Alternatively, after the third mask 323a is removed, the inorganic insulating layer 25 may be etched using the pixel electrodes 23 as masks. In this case, the following etchant needs to be used: an etchant for controlling the etching selectivity of the pixel electrodes 23 to the inorganic insulating layer 25.

The openings 26 extending through the inorganic insulating layer 25 to the organic insulating layer 284 are thereby formed in the regions having no pixel electrodes 23. According to this procedure, the release of moisture contained in the organic insulating layer 284 is not prevented by the inorganic insulating layer 25 and therefore the moisture therein can be removed through the openings 26. This prevents dark spots from being caused by the diffusion of the moisture into the light-emitting layer 60 from the organic insulating layer 284.

In this embodiment, after the pixel electrodes 23 are formed, the openings 26 are formed in the inorganic insulating layer 25. According to this procedure, the inorganic insulating layer 25 entirely covers the organic insulating layer 284 during the formation of the pixel electrodes 23; hence, the organic insulating layer 284 can be protected from the etching solution for forming the pixel electrodes 23. This prevents the organic insulating layer 284 from being eroded or swelling due to the etching solution and also prevents the organic insulating layer 284 from being cracked or peeled off.

In this embodiment, since the inorganic insulating layer 25 is etched through the mask for forming the pixel electrodes 23 or using the pixel electrodes 23 as masks, any mask only for forming the openings 26 need not be used. This leads to a reduction in manufacturing cost. The openings 26 are formed by etching the inorganic insulating layer 25 such that the openings 26 occupy most of the regions having no pixel electrodes 23. This allows the openings 26 to have a maximum area; hence, the moisture can be readily removed from the organic insulating layer 284. This prevents the dark spots from being caused.

In this embodiment, after the pixel electrodes 23 are formed, the openings 26 are formed in the inorganic insulating layer 25. However, the openings 26 may be formed during the formation of the inorganic insulating layer 25.

Figure 6A:
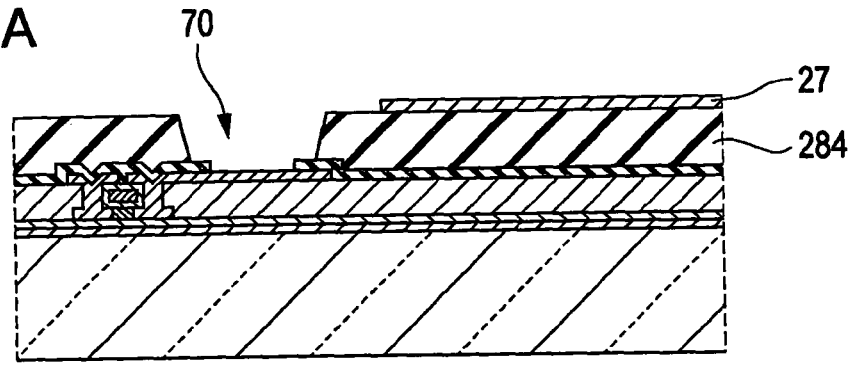
FIG. 6A is a sectional view showing a step included in a modification of the method of the second embodiment.
Figure 6B:
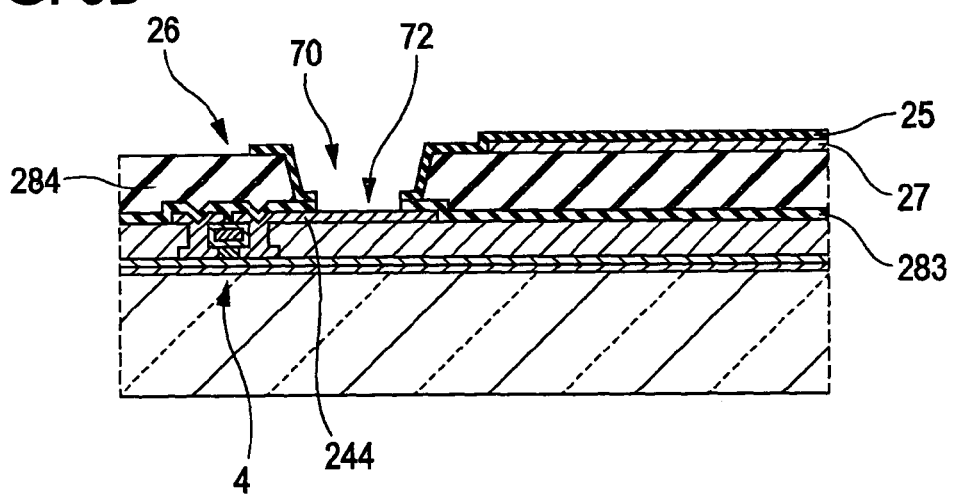
FIG. 6B is a sectional view showing a step included in a modification of the method of the second embodiment.
Figure 6C:
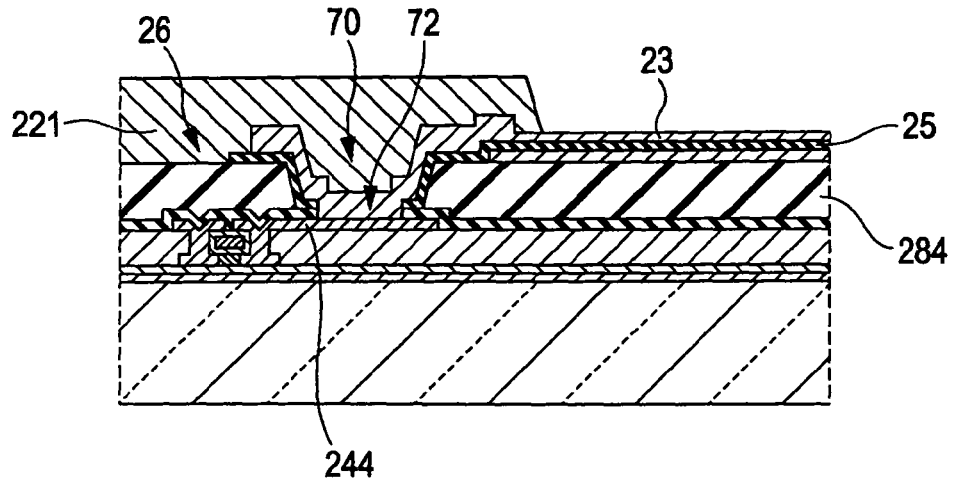
FIG. 6C is a sectional view showing a step included in a modification of the method of the second embodiment.

FIGS. 6A to 6C are sectional views, taken along the line IIA-IIA of FIG. 1A, showing steps included in a modification of the method of this embodiment. As shown in FIG. 6A, the reflective layers 27 are formed on the organic insulating layer 284 having the contact holes 70. As shown in FIG. 6B, the inorganic insulating layer 25 is formed over the reflective layers 27 and the walls and bottoms of the contact holes 70. In order to uncover the drain electrodes of the driving TFTs 4, the through holes 72 are formed so as to extend from the bottoms of the contact holes 70 through the inorganic insulating layer 25 and the first interlayer insulating layer 283. The openings 26 are formed in the inorganic insulating layer 25 simultaneously with the formation of the through holes 72 so as to extend to the organic insulating layer 284. As shown in FIG. 6C, the pixel electrodes 23 are then formed over surface portions of the inorganic insulating layer 25 and the walls and bottoms of the contact holes 70.

The openings 26 are formed simultaneously with the formation of the through holes 72 as described above. This allows the openings 26 to be efficiently formed without increasing the number of manufacturing steps. This leads to a reduction in manufacturing cost.

With reference back to FIG. 4B, the organic partitions 221 are formed around the pixel electrodes 23 such that portions of the organic partitions 221 are disposed on end portions of the pixel electrodes 23. This allows the openings 26 in the inorganic insulating layer 25 to be covered with the organic partitions 221. In particular, a photosensitive resin is applied over the element substrate 2 and subjected to exposure and then development, whereby the organic partitions 221 are formed so as to have open zones 221a.

The resin for forming the organic insulating layer 284 and the organic partitions 221 contains a trace amount of moisture. Therefore, moisture is removed from the organic insulating layer 284 and the organic partitions 221 by heating the organic insulating layer 284 and the organic partitions 221. For example, the organic insulating layer 284 and the organic partitions 221 are heated at about 150° C. to 250° C. for about five to 120 minutes in a dry air atmosphere or at a pressure of about $10^3$ to $10^{-3}$ Pa. This allows moisture contained in the organic partitions 221 to be released from the surfaces of the organic partitions 221 and also allows moisture contained in the organic insulating layer 284 to be released from the surfaces of the organic partitions 221 through the openings 26 in the inorganic insulating layer 25.

Since the organic insulating layer 284 and the organic partitions 221 are heated at the same time, moisture can be efficiently removed from the organic insulating layer 284 and the organic partitions 221 without increasing the number of manufacturing steps. If the organic insulating layer 284 only is dried in a step which is subsequent to the formation of the openings 26 in the inorganic insulating layer 25 and which is prior to the formation of the organic partitions 221, moisture contained in the organic insulating layer 284 can be securely removed.

Figure 4A:
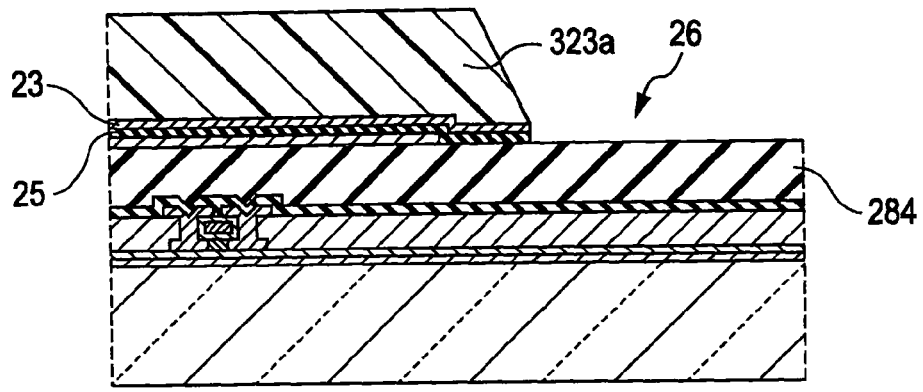
FIG. 4A is a sectional view showing a step included in the method of the second embodiment.
Figure 4B:
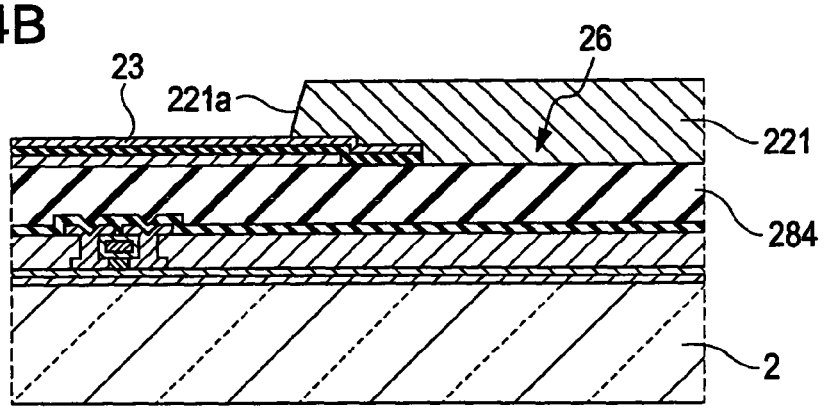
FIG. 4B is a sectional view showing a step included in the method of the second embodiment.
Figure 4C:
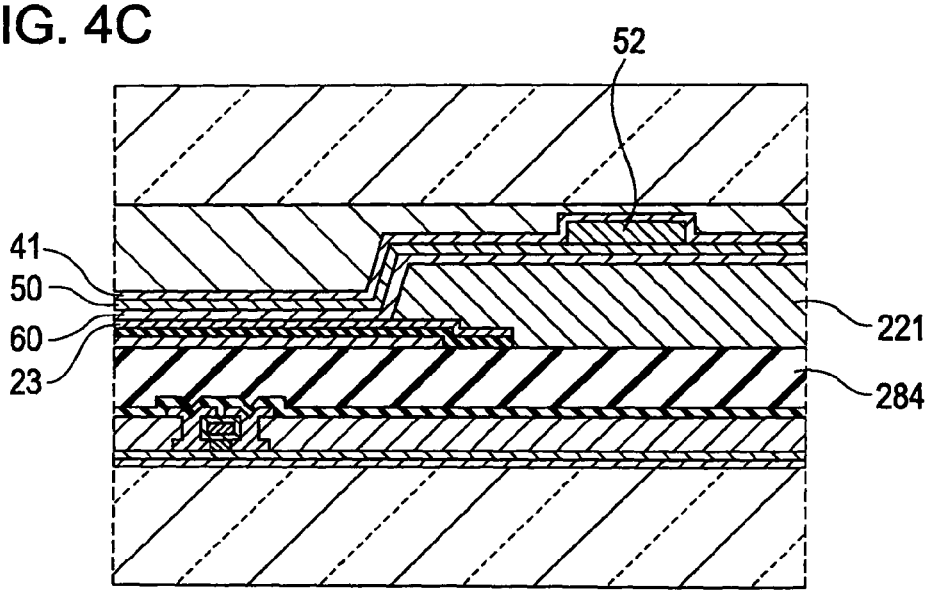
FIG. 4C is a sectional view showing a step included in the method of the second embodiment.

As shown in FIG. 4C, the light-emitting layer 60 is formed over the pixel electrodes 23 and the organic partitions 221. A vapor phase process such as a vacuum vapor deposition process or a CVD process can be used to form the light-emitting layer 60. When the light-emitting layer 60 is formed in a dry atmosphere, the following process can be used: a liquid phase process such as a spin-coating process, a spray-coating process, a dipping process, a printing process, or a droplet ejection process. In particular, the droplet ejection process, of which examples include an inkjet process and a dispensing process, is capable of precisely applying a predetermined amount of each droplet to a predetermined portion and therefore is useful in precisely forming the light-emitting layer 60.

The common electrode 50, the auxiliary electrode 52, the inorganic sealing layer 41, and the like are formed in that order without exposing the organic insulating layer 284, the organic partitions 221, and the light-emitting layer 60 to air. In such a manner as described above, the light-emitting device can be obtained.

As described above, in the light-emitting device, the openings 26 are formed in the regions having no pixel electrodes 23. In the method of this embodiment, before the light-emitting layer 60 is formed, the openings 26 are formed in the regions having no pixel electrodes 23. According to this procedure, the inorganic insulating layer 25 does not prevents the release of moisture contained in the organic insulating layer 284 and therefore the moisture therein can be removed through the openings 26. This prevents dark spots from being caused by the diffusion of the moisture into the light-emitting sections from the organic insulating layer 284.

In a conventional light-emitting device, cracks are initiated at corners of reflective layers to propagate along end portions of the reflective layers to extend through an inorganic insulating layer and pixel electrodes in some cases. However, in the method of this embodiment, the moisture contained in the organic insulating layer 284 can be removed and therefore can be prevented from being diffused through such cracks.

Third Embodiment

A third embodiment of the present invention provides an electronic apparatus including the light-emitting device of the first embodiment. The electronic apparatus will now be described with reference to FIG. 7.

Figure 7:
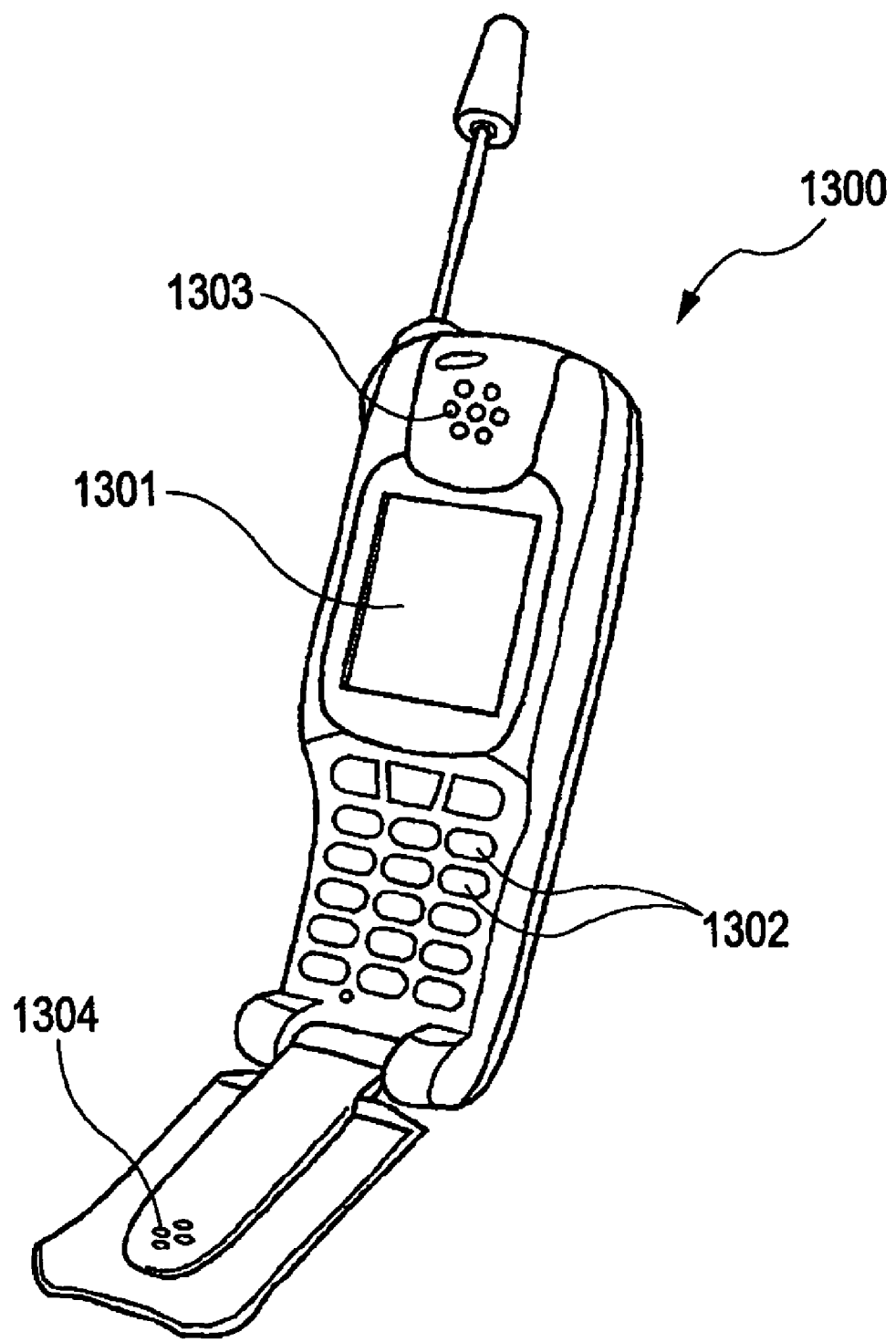
FIG. 7 is a perspective view of a mobile phone.
Figure 8A:
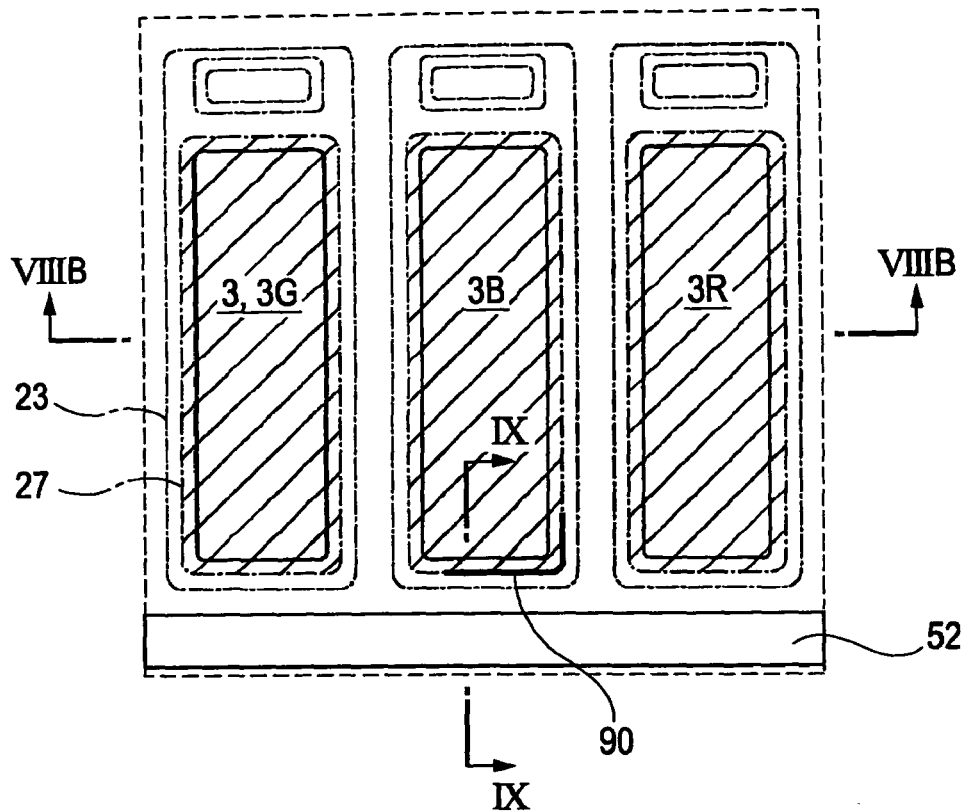
FIG. 8A is a plan view of a conventional light-emitting device.
Figure 8B:
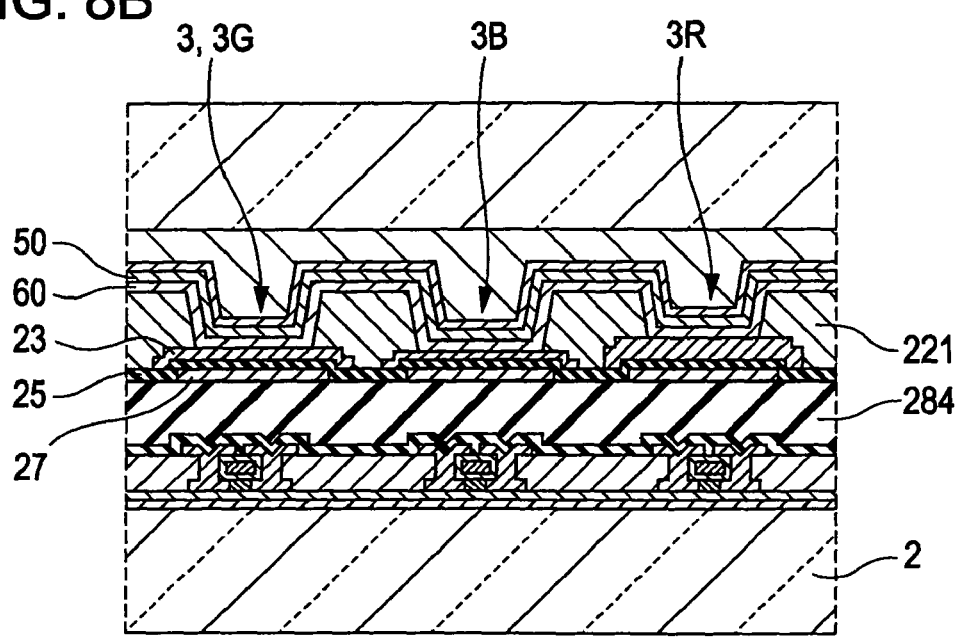
FIG. 8B is a sectional view of the conventional light-emitting device taken along the line VIIIB-VIIIB of FIG. 8A.
Figure 9:
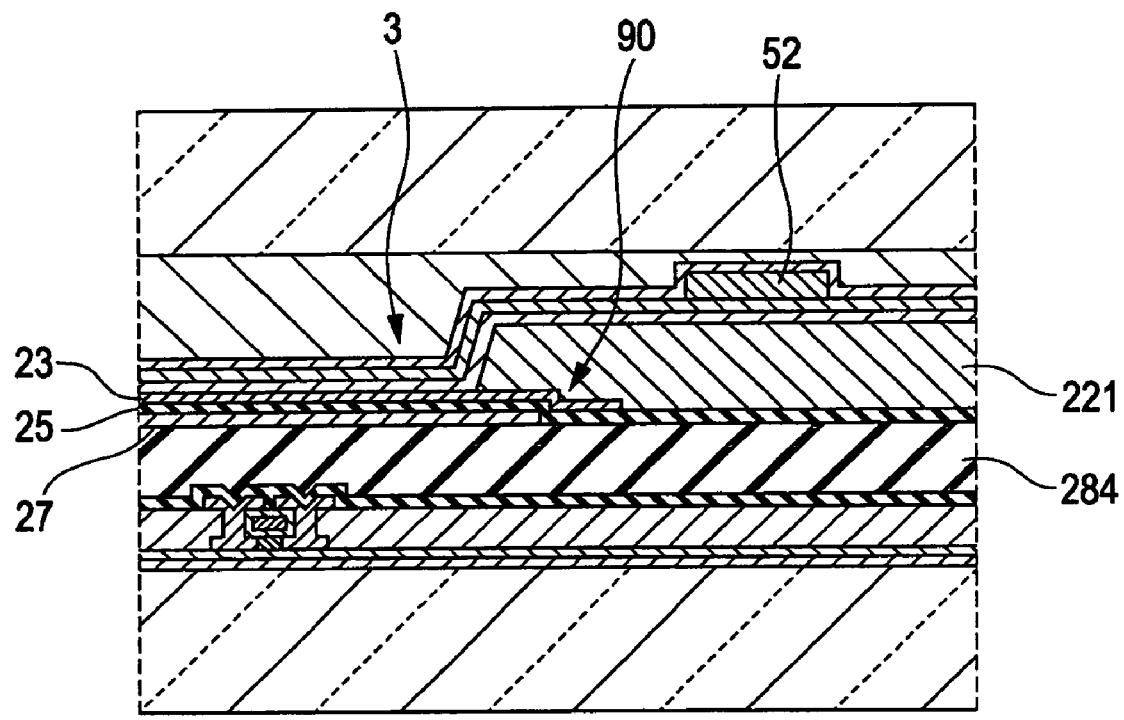
FIG. 9 is a sectional view of the conventional light-emitting device taken along the line IX-IX of FIG. 8A.

FIG. 7 is a perspective view of a mobile phone that is an example of the electronic apparatus. With reference to FIG. 7, the mobile phone is represented by reference numeral 1300 and includes a plurality of operation buttons 1302, an earpiece 1303, a mouthpiece 1304, and a display section 1301 including the light-emitting device. Since dark spots can be prevented from arising in the light-emitting device, the mobile phone has high reliability.

The electronic apparatus is not limited to the mobile phone. Examples of the electronic apparatus include digital cameras, personal computers, televisions, portable televisions, viewfinder-type or direct view-type video tape recorders, personal data assistants (PDAs), portable game machines, pagers, electronic notebooks, portable electronic calculators, watches, word processors, work stations, video phones, point-of-sale (POS) terminals, apparatuses including touch panels, vehicle-mounted audio systems, instruments for vehicle use, vehicle-mounted displays such as car navigation systems, and optical printer heads.

The scope of the present invention is not limited to the above embodiments. Various modifications may be made to the above embodiments within the scope of the present invention. The materials and structures described in detail in the embodiments are merely examples and may be modified. A light-emitting device according to an embodiment of the present invention can be used for display units, having a micro-cavity structure, for top emission-type organic EL apparatuses; backlights for reflective or transflective liquid crystal apparatuses; and other apparatus.

What is claimed is:

1. A light-emitting device comprising:
   an organic insulating layer lying above a face of a substrate;
   reflective layers arranged above a face of the organic insulating layer;
   an inorganic insulating layer extending over the reflective layers;
   pixel electrodes arranged above the inorganic insulating layer; and
   light-emitting sections arranged above the respective pixel electrodes,
   each of the pixel electrodes being greater than each of the reflective layers in plan view,
   each of the pixel electrodes having peripheral edges, the peripheral edges of the pixel electrodes completely overlapping the inorganic insulating layer in plan view,
   the inorganic insulating layer having an opening in plan view in a region between the pixel electrodes,
   the inorganic insulating layer has a width greater than the reflective layers in plan view, and
   the pixel electrodes have a width equal to the width of the inorganic insulating layer in plan view.

2. The light-emitting device according to claim 1, the inorganic insulating layer having a function of protecting the reflective layers and the organic insulating layer from an etching solution for forming the pixel electrodes by pattering.

3. The light-emitting device according to claim 1, the inorganic insulating layer having a width greater than each of the reflective layers in plan view.

4. A light-emitting device comprising:
an organic insulating layer lying above a face of a substrate;
reflective layers arranged above a face of the organic insulating layer;
an inorganic insulating layer extending over the reflective layers;
pixel electrodes arranged above the inorganic insulating layer; and
light-emitting sections arranged above the respective pixel electrodes,
each of the reflective layers having a first surface facing to the inorganic insulating layer and side surfaces, the first surface and the side surfaces of each of the reflective layers being covered with the inorganic insulating layer,
each of the pixel electrodes having peripheral edges, the peripheral edges of the pixel electrodes overlapping the inorganic insulating layer in plan view,
the inorganic insulating layer having an opening in plan view in a region between the pixel electrodes,
the inorganic insulating layer has a width greater than the reflective layers in plan view, and
the pixel electrodes have a width equal to the width of the inorganic insulating layer in plan view.

5. The light-emitting device according to claim 4, the inorganic insulating layer having a function of protecting the reflective layers and the organic insulating layer from an etching solution for forming the pixel electrodes by patterning.

6. The light-emitting device as set forth in claim 4, the pixel electrodes completely overlap the inorganic insulating layer in plan view.

7. A light-emitting device, comprising on a substrate:
a transistor;
an organic insulating film arranged on the transistor;
a reflective film arranged on the organic insulating film;
an inorganic insulating film arranged on the reflective film;
a pixel electrode having a peripheral edge arranged on the inorganic insulating film; and
a light-emitting layer arranged on the pixel electrode,
in a plan view, in a first region in which the pixel electrode including a contact hole connecting the pixel electrode and the transistor is formed, the inorganic insulating film being formed so as to be overlapped by the peripheral edge of the pixel electrode,
in a second region between the pixel electrode and an adjacent pixel electrode, a portion being arranged in which the inorganic insulating film is not formed,
the inorganic insulating film has a width greater than the reflective film in plan view, and
the pixel electrode has a width equal to the width of the inorganic insulating film in plan view.

8. A light-emitting device, comprising on a substrate:
an organic insulating film arranged on the substrate;
a reflective film arranged on the organic insulating film;
an inorganic insulating film arranged on the reflective film;
a pixel electrode having a peripheral edge arranged on the inorganic insulating film; and
a light-emitting layer arranged on the pixel electrode,
in a first region in which the pixel electrode is formed, the inorganic insulating film being formed so as to be overlapped by at least the peripheral edge of the pixel electrode in a plan view,
in a second region between the pixel electrode and an adjacent pixel electrode, the inorganic insulating film is not arranged over at least a portion of the organic insulating film in plan view,
the inorganic insulating film has a width greater than the reflective film in plan view, and
the pixel electrode has a width equal to the width of the inorganic insulating film in plan view.

9. The light-emitting device as set forth in claim 8,
in the second region between the pixel electrode and an adjacent pixel electrode, the inorganic insulating film is not arranged over a majority of the organic insulating film in plan view.

* * * * *